(12) United States Patent
Ahn et al.

(10) Patent No.: US 10,297,785 B2
(45) Date of Patent: May 21, 2019

(54) FOLDABLE DISPLAY APPARATUS

(71) Applicant: Samsung Display Co., Ltd., Yongin-si, Gyeonggi-do (KR)

(72) Inventors: Sungsang Ahn, Yongin-si (KR); Taehyeog Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/138,297

(22) Filed: Sep. 21, 2018

(65) Prior Publication Data

US 2019/0027703 A1 Jan. 24, 2019

Related U.S. Application Data

(63) Continuation of application No. 14/975,689, filed on Dec. 18, 2015.

(30) Foreign Application Priority Data

Jun. 30, 2015 (KR) ........................ 10-2015-0093232

(51) Int. Cl.
*H01L 51/52* (2006.01)
*H04M 1/02* (2006.01)
(Continued)

(52) U.S. Cl.
CPC ............ *H01L 51/5237* (2013.01); *G06F 1/16* (2013.01); *H04M 1/0214* (2013.01); (Continued)

(58) Field of Classification Search
CPC ...... G06F 1/1656; G06F 1/187; G06F 1/1601; G06F 1/1637; G06F 1/181; G06F 11/3044; G06F 2200/1631; G06F 1/16; G11B 33/00; H05K 1/0203; H05K 2201/066; H05K 7/205; H05K 2201/10393; H05K 7/2039; H05K 7/20418; H05K 7/20427; H05K 7/20436; H05K 7/20445; H05K 7/20454;
(Continued)

(56) References Cited

U.S. PATENT DOCUMENTS 8,971,031 B2 * 3/2015 Mok ...................... G06F 1/1652
361/679.27
9,176,535 B2 * 11/2015 Bohn ..................... G06F 1/1641
(Continued)

FOREIGN PATENT DOCUMENTS

KR 10-2011-0100936 A 9/2011
KR 10-2012-0081502 A 7/2012
(Continued)

*Primary Examiner* — Pete T Lee
(74) *Attorney, Agent, or Firm* — Lewis Roca Rothgerber Christie LLP (57) ABSTRACT

A foldable display apparatus that is adjustable between a folded configuration and unfolded configuration includes a flexible display panel that is foldable; a case including a first case that supports a first side of the flexible display panel and a second case that supports a second side of the flexible display panel; a link member connecting the first case to the second; and a locking unit configured to prevent rotation of the first case and the second case in a folding direction when the foldable display apparatus is in the unfolded configuration.

27 Claims, 10 Drawing Sheets

(51) Int. Cl.
*G06F 1/16* (2006.01)
*H05K 1/02* (2006.01)
*H01L 29/786* (2006.01)

(52) U.S. Cl.
CPC .......... *H04M 1/0268* (2013.01); *H05K 1/028* (2013.01); *H01L 29/7869* (2013.01); *H01L 2251/5338* (2013.01)

(58) Field of Classification Search
CPC ........... H05K 7/20463; H05K 7/20472; H05K 7/20481; H05K 7/2049; H05K 7/20509; H05K 7/20518; H05K 7/20854; H05K 7/20863; H05K 7/209; H05K 7/20909; H05K 7/20963; H05K 7/20972; H05K 2201/2027; H05K 7/1448; H05K 7/1474; H05K 2201/10681; H05K 1/0277; H05K 1/028; H05K 1/0283; H05K 1/147; H05K 1/189; H05K 2201/051; H05K 2201/052; H05K 2201/053; H05K 2201/055; H05K 2201/056; H05K 2201/057; H05K 2201/058; H05K 5/0021; H05K 7/1401; H05K 7/1409; H05K 7/1417; H05K 7/1015; H05K 7/1023; H05K 7/103; H05K 7/1038; H05K 7/1053; H05K 7/1061; H05K 7/1069; H05K 1/118; H05K 1/148; H05K 3/4691; H05K 2251/5338; H01L 23/40; H01L 23/4006; H01L 2224/75754; H01L 2224/80136; H01L 2224/80139; H01L 2224/81136; H01L 2224/81141; H01L 2224/83136; H01L 2224/84136; H01L 51/5237; H01L 29/7869; H01L 2251/5338; H04M 1/0214; H04M 1/0268

See application file for complete search history.

(56) References Cited

U.S. PATENT DOCUMENTS

| | | |
|---|---|---|
| 2002/0067339 A1 | 6/2002 | Min |
| 2013/0342090 A1 | 12/2013 | Ahn et al. |
| 2014/0029212 A1 | 1/2014 | Hwang et al. |
| 2015/0261259 A1* | 9/2015 | Endo ............... G06F 1/1652 361/679.06 |
| 2016/0018855 A1* | 1/2016 | Liao ................ G06F 1/1616 361/679.56 |
| 2016/0085271 A1* | 3/2016 | Morrison ........ G06F 1/1681 361/679.27 |

FOREIGN PATENT DOCUMENTS

| | | |
|---|---|---|
| KR | 10-2013-0073331 A | 7/2013 |
| KR | 10-2014-0001376 A | 1/2014 |
| KR | 10-2014-0015881 A | 2/2014 |
| KR | 10-2014-0091274 A | 7/2014 |

* cited by examiner

FOLDABLE DISPLAY APPARATUS

CROSS-REFERENCE TO RELATED APPLICATION

This application is a continuation of U.S. patent application Ser. No. 14/975,689, filed Dec. 18, 2015, which claims priority to, and the benefit of, Korean Patent Application No. 10-2015-0093232, filed on Jun. 30, 2015, in the Korean Intellectual Property Office, the entire content of both of which is incorporated herein by reference.

BACKGROUND

1. Field

One or more exemplary embodiments of the present invention relate to a foldable display apparatus.

2. Description of the Related Art

Flat-panel display apparatuses, such as organic light-emitting display devices, may be flexibly deformed, and thus may be made foldable so that they can be conveniently carried.

SUMMARY

One or more exemplary embodiments of the present invention include a foldable display apparatus.

Additional aspects are set forth in part in the description that follows and, in part, will be apparent from the description, or may be learned by practice of the presented embodiments.

According to one or more exemplary embodiments of the present invention, a foldable display apparatus that is adjustable between a folded configuration and an unfolded configuration includes a flexible display panel that is foldable; a case including a first case that supports a first side of the flexible display panel and a second case that supports a second side of the flexible display panel; a link member connecting the first case to the second case; and a locking unit configured to prevent rotation of the first case and the second case in a folding direction when the foldable display apparatus is in the unfolded configuration.

The locking unit may include a slide cover rotatably coupled to the first case and slidably coupled to the second case; and a locking lever rotatably mounted on the second case and configured to prevent sliding of the slide cover when the locking lever is in a locked position.

The slide cover may slide along a rail groove in the second case when the first case and the second case are rotated to move the foldable display apparatus between the folded configuration and the unfolded configuration. Rotation of the first and second cases may be inhibited when movement of the slide cover along the rail groove is blocked.

A body center of the slide cover may be adjacent the link member when the foldable display apparatus is in the unfolded configuration, and the body center of the slide cover may be moved toward the second case along the rail groove when the foldable display apparatus is moved from the unfolded configuration to the folded configuration.

The second case may define an insertion groove in a surface thereof and on which the slide cover and the locking lever are mounted.

The insertion groove may restrict a sliding range of the slide cover and may restrict a rotating range of the locking lever.

The slide cover and the locking lever may be accommodated in a depth of the insertion groove.

The link member may include a concave-convex type metal sheet.

End surfaces of the concave-convex type metal sheet may be respectively attached to a first end surface of the first case and a second end surface of the second case.

The foldable display apparatus may further include an elastic piece connecting the first case to the second case.

The first case and the second case may each have a stepped surface, and the elastic piece may be attached to the stepped surfaces of the first case and of the second case.

The flexible display panel may be outwardly exposed when the foldable display apparatus is in the folded configuration.

A folded portion of the flexible display panel may be supported by the link member when the foldable display apparatus is in the folded configuration.

The link member may include a concave-convex type metal sheet.

The first case and the second case may each define a coupling groove coupled to the flexible display panel.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

As the present invention allows for various changes and numerous embodiments, particular embodiments are illustrated in the drawings and described in detail in the written description. Hereinafter, aspects of the present invention and a method for accomplishing them are described more fully with reference to the accompanying drawings, in which exemplary embodiments of the invention are shown. This invention may, however, be embodied in many different forms and should not be construed as limited to the exemplary embodiments set forth herein.

One or more embodiments of the invention are described below in more detail with reference to the accompanying drawings. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

The terminology used herein is for the purpose of describing particular embodiments and is not intended to be limiting of the present invention. As used herein, the singular forms "a" and "an" are intended to include the plural forms as well, unless the context clearly indicates otherwise.

It will be further understood that the terms "comprises," "comprising," "includes," and/or "including" as used herein specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Figure 1:
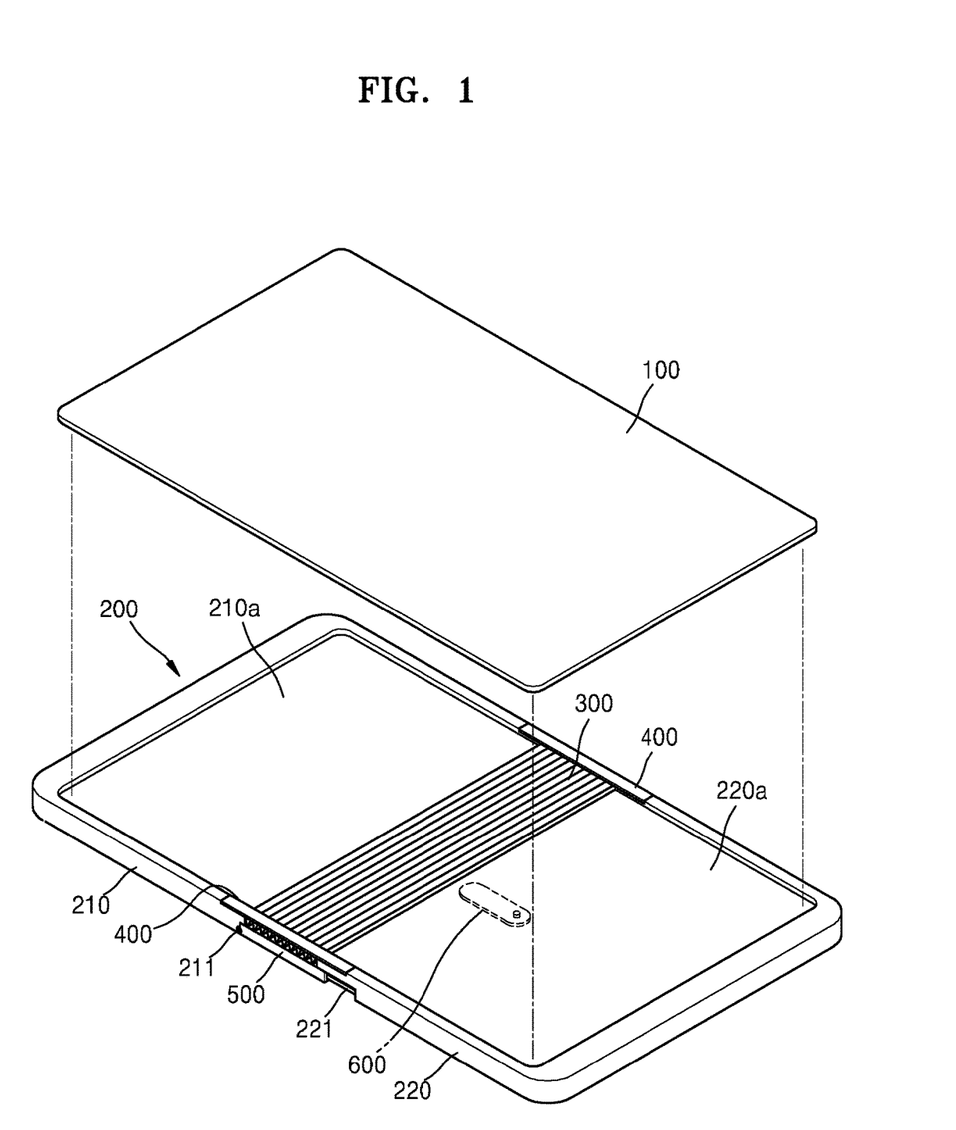
FIG. 1 is a perspective view of a foldable display apparatus according to one or more exemplary embodiments of the present invention.

FIG. 1 is a perspective view of a foldable display apparatus according to one or more exemplary embodiments of the present invention.

The foldable display apparatus includes, as a display, a flexible display panel 100 that is capable of being flexibly bent. The flexible display panel 100 is a structure in which a thin film transistor and a light-emitting device for displaying an image, and an encapsulation layer that covers and protects the thin film transistor and the light-emitting device, are generally stacked on a flexible substrate. Because the flexible substrate is used instead of a rigid glass substrate, the flexible display panel 100 may be moved between a folded or unfolded configuration (e.g., may be freely folded or unfolded) within an allowable flexibility range. Thus, in a folding state (e.g., the folded configuration), the flexible display panel 100 may be folded as shown in FIGS. 4D and 5D.

The flexible display panel 100 may be supported by a case 200 that includes first and second cases 210 and 220 such that the flexible display panel 100 may be folded or unfolded. In other words, one end (e.g., a first end) of the flexible display panel 100 is accommodated in, and supported by, a first coupling groove 210a of the first case 210, and another end (e.g., a second end opposite to the first end) of the flexible display panel 100 is accommodated in, and supported by, a second coupling groove 220a of the second case 220. Hereinafter, surfaces of the first and second cases 210 and 220, at the side of the first and second coupling grooves 210a and 220a on which the flexible display panel 100 is mounted are referred to as front surfaces, and surfaces on the opposite side of the first and second coupling grooves 210a and 220a are referred to as rear surfaces.

The first and second cases 210 and 220 are connected to each other via a link member, for example, a ribbed (or concave-convex-type) sheet (e.g., a metal sheet) 300. In other words, both ends of the concave-convex type metal sheet 300 are attached to surfaces of the first and second cases 210 and 220 that face each other, such that the first and second cases 210 and 220 may be hinged. Accordingly, when the concave-convex type metal sheet 300 is moved between being bent or unbent, the first and second cases 210 and 220 are folded or unfolded.

Elastic pieces 400 are attached on stepped surfaces 212 and 222 (see FIG. 2) that are respectively formed on the first and second cases 210 and 220, and thus the elastic pieces 400 connect the stepped surfaces 212 and 222 to each other. The elastic pieces 400 help the first and second cases 210 and 220 collectively maintain a flat state when the first and second cases 210 and 220 are unfolded. In other words, when being unfolded, the first and second cases 210 and 220 become flat in a straight or substantially straight line (see FIGS. 4A and 5A), and, when the first and second cases 210 and 220 are folded, the concave-convex type metal sheet 300 is bent, and thus the first and second cases 210 and 220 are folded to overlap with each other (see FIGS. 4D and 5D). The elastic pieces 400 secure (or hold) the first and second cases 210 and 220 such that the flexible display panel 100 may properly maintain a flat state when being unfolded.

When the first and second cases 210 and 220 are in the unfolded configuration, the case 200 should not be accidentally (or unintentionally) folded again in a folding direction. Thus, a slide cover 500 and a locking lever 600, for example, may be included as locking units for preventing or inhibiting accidental (or unintentional) re-folding.

Figure 2:
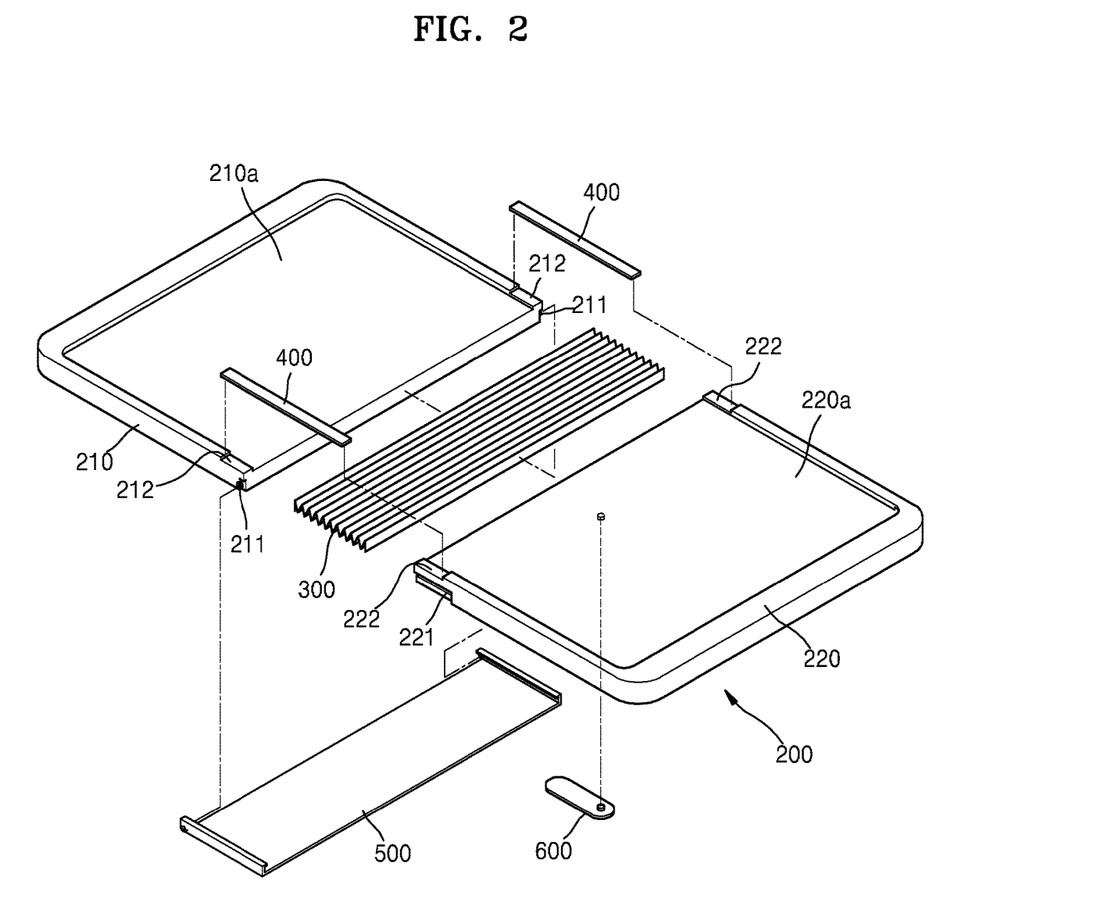
FIG. 2 is an exploded perspective view of a case included in the foldable display apparatus illustrated in FIG. 1.

The slide cover 500 may be rotatably coupled to a rotational shaft 211 formed on the first case 210, and may also be slidably coupled to a rail groove 221 formed in the second case 220. Thus, while the first and second cases 210 and 220 are folded or unfolded, the slide cover 500 slides along the rail groove 221 while rotating about the rotational shaft 211. In other words, the rail groove 221 is provided as a path along which the slide cover 500 may move during a rotating operation for folding or unfolding the first and second cases 210 and 220, and, when the slide cover 500 does not move (or is hindered from moving) along the rail groove 221, the first and second cases 210 and 220 enter a locking state in which the first and second cases 210 and 220 cannot rotate.

The locking lever 600 inhibits or stops rotation of the first and second cases 210 and 220, namely, inhibits or stops re-folding of the first and second cases 210 and 220, by preventing or inhibiting (e.g., selectively preventing) movement of the slide cover 500. The locking lever 600 is rotatably mounted on a rear surface of the second case 220.

Figure 3A:
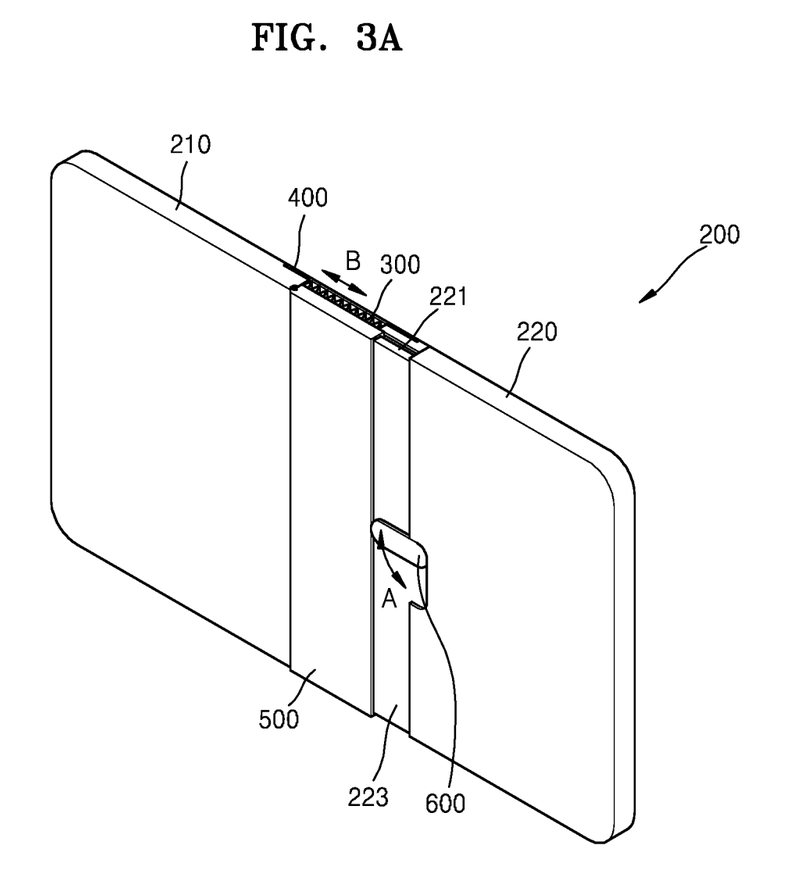
FIGS. 3A-3B are rear surface perspective views respectively showing an unfolded state and a folded state of the foldable display apparatus of FIG. 1.
Figure 3B:
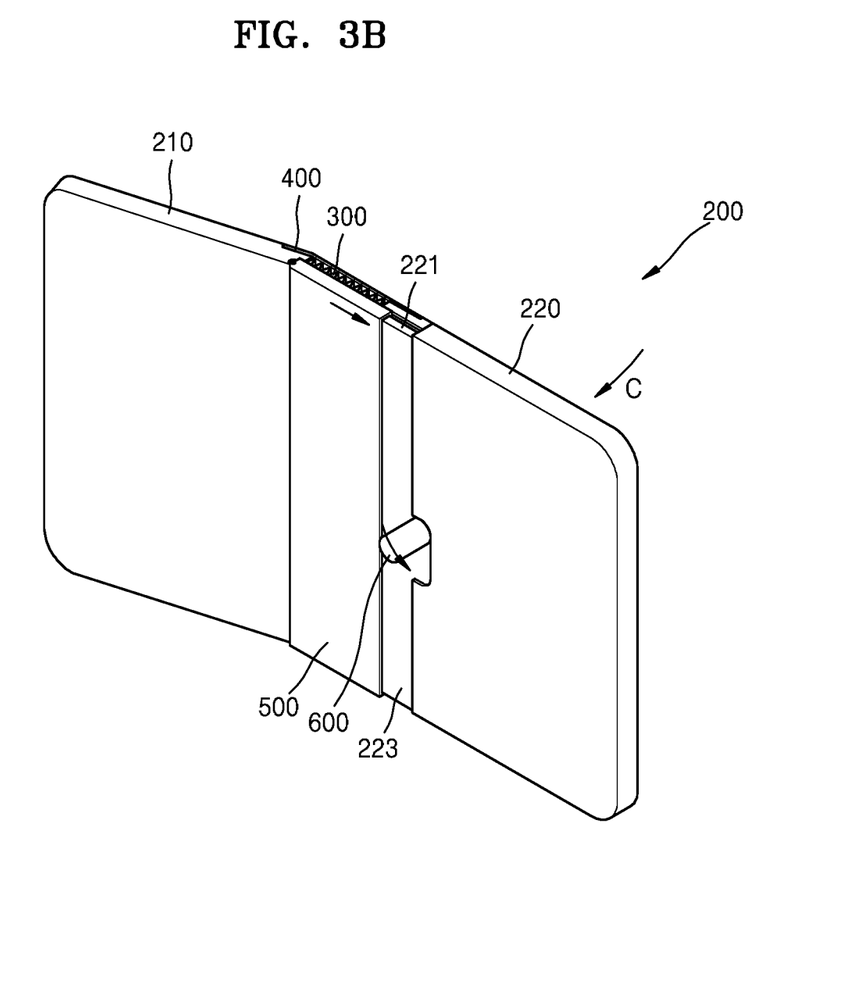

FIGS. 3A and 3B respectively illustrate the foldable display apparatus according to one or more embodiments of the present invention in a locked configuration and an unlocked configuration according to movement of the locking lever 600 and the slide cover 500.

Referring to FIG. 3A, the locking lever 600 may rotate in a direction indicated by arrow A on the second case 220, and the slide cover 500 may slide in a direction indicated by arrow B. However, when the locking lever 600 has been rotated to be substantially perpendicular to the slide cover 500 as illustrated in FIG. 3A, the slide cover 500 may not move. In other words, if the locking lever 600 is not utilized, the slide cover 500 may move along the rail groove 221 because a path of movement of the slide cover 500 is not blocked. However, in a state (or configuration) as shown in FIG. 3A, because the locking lever 600 blocks the moving path of the slide cover 500, the slide cover 500 is unable to move. When the first and second cases 210 and 220 rotate in a folding direction, the slide cover 500 naturally moves along the rail groove 221. However, when the slide cover 500 is unable to move, the first and second cases 210 and 220 are unable to rotate. In other words, the first and second cases 210 and 220 are locked such that the first and second cases 210 and 220 may not be folded again from an unfolded state when the slide cover 500 is unable to move.

However, when the locking lever 600 is released from a locking position by being at least slightly rotated, as shown in FIG. 3B, the slide cover 500 is able to move along the rail groove 221 while also pushing (or further rotating) the locking lever 600, and thus the first and second cases 210 and 220 are able to be folded in a direction indicated by arrow C. An insertion groove 223 may be formed in the rear surface of the second case 220. The slide cover 500 and the locking lever 600 are inserted (or accommodated) in the insertion groove 223, and thus do not protrude outward from a surface adjacent to the slide cover 500 and the locking lever 600. As illustrated in FIGS. 3A and 3B, the insertion groove 223 restricts a sliding range of the slide cover 500, and restricts a rotating range of the locking lever 600 to the area of the insertion groove 223.

During folding, the first and second cases 210 and 220 are folded in a direction such that the flexible display panel 100 is exposed outwardly (see FIGS. 4D and 5D). During folding, a folded portion of the flexible display panel 100 is supported by the link member, for example, the concave-convex type metal sheet 300. Because the folded portion is stably supported according to a curvature of the concave-convex type metal sheet 300 even when an external force is applied to the folded portion, the folded portion is neither easily wrinkled nor deformed.

Figure 6:
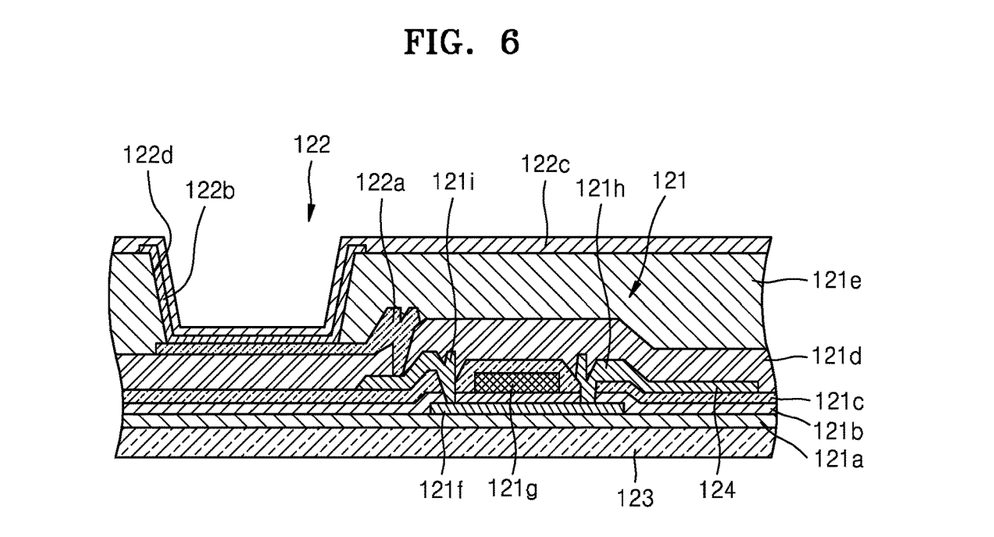
FIG. 6 is a cross-sectional view showing a detailed structure of a flexible display panel included in the foldable display apparatus of FIG. 1.

Folding and unfolding operations are described in more detail below. Turning now to an internal structure of the flexible display panel 100, the flexible display panel 100 may have, for example, a structure as shown in FIG. 6. In other words, a thin film transistor 121 and an organic light-emitting device 122 are included in the flexible display panel 100, and the organic light-emitting device 122 includes an emission layer 122b that is vulnerable to, particularly, contact with gas. In more detail, an active layer 121f is formed on a buffer layer 121a that is adjacent to a flexible substrate 123, and the active layer 121f has source and drain regions doped with N-type or P-type impurities at a high concentration. The active layer 121f may include an oxide semiconductor. For example, the oxide semiconductor may include an oxide of a material selected from the group consisting of Groups 4, 12, 13, and 14 metal elements, such as zinc (Zn), indium (In), gallium (Ga), stannum (Sn), cadmium (Cd), germanium (Ge), hafnium (Hf), and/or a combination thereof. For example, the active layer 121f may include G-I-Z-O [(In2O3a(Ga2O3b(ZnO)c], wherein a, b, and c are integers that respectively satisfy a≥0, b≥0, and c>0. A gate insulating layer 121b is formed on the active layer 121f, and a gate electrode 121g is formed on the gate insulating layer 121b. A source electrode 121h and a drain electrode 121i are formed on the gate electrode 121g. An interlayer insulating layer 121c is included between the gate electrode 121g and each of the source electrode 121h and the drain electrode 121i, and a passivation layer 121d is interposed between an anode 122a of the organic light-emitting device 122 and each of the source electrode 121h and the drain electrode 121i.

The organic light-emitting device 122 includes an insulative planarization layer 121e (e.g., a pixel defining layer), which may include acryl, for example, on the anode 122a, and also includes an aperture 122d that is formed in the insulative planarization layer 121e.

The organic light-emitting device 122 displays an image (e.g., predetermined image information) by emitting red, green, and blue light as current flows therethrough. The organic light-emitting device 122 includes the anode 122a, which is connected to the drain electrode 121i of the thin film transistor 121, and to which a positive power voltage is applied, includes a cathode 122c, which is formed to cover the entire pixel, and to which a negative power voltage is applied, and also includes the emission layer 122b, which is disposed between the anode 122a and the cathode 122c to emit light.

A hole injection layer (HIL), a hole transport layer (HTL), an electron transport layer (ETL) and an electron injection layer (EIL), for example, may be stacked adjacent to the emission layer 122b.

For reference, the emission layer 122b may be formed in each pixel to form a single unit pixel that includes pixels that emit red, green, and blue light beams. The emission layers 122b formed in the pixels may be spaced apart from one another. Alternatively, an emission layer may be commonly formed over the entire pixel region, regardless of locations of the pixels. In this case, the emission layer 122b may be formed by stacking a light-emitting substance that is configured to emit a red light, a light-emitting substance that is configured to emit a green light, and a light-emitting substance that is configured to emit a blue light on one another, or by mixing a light-emitting substance that is configured to emit a red light, a light-emitting substance that is configured to emit a green light, and a light-emitting substance that is configured to emit a blue light. Any combination of other various colors that is capable of emitting white light may be utilized in addition to, or as an alternative to, a combination of red, green, and blue colors. The flexible display panel 100 may further include a color converting layer or a color filter that converts the white light into a light of a corresponding color.

In other embodiments, a thin film encapsulation layer, in which an organic layer and an inorganic layer are alternately stacked on one another, may be additionally formed on the cathode 122c.

Because the flexible display panel 100 is flexibly deformable, the flexible display panel 100 may be used while being folded or unfolded according to folding and unfolding operations of the case 200.

A foldable display apparatus as described above may be used as shown in FIGS. 4A-4D and FIGS. 5A-5D. FIGS. 4A-4D are side views sequentially showing a change in the state of the foldable display apparatus from an unfolded state/configuration to a folded state/configuration. FIGS. 5A-5D are rear surface perspective views respectively corresponding to the processes of FIGS. 4A-4D.

Figure 4A:
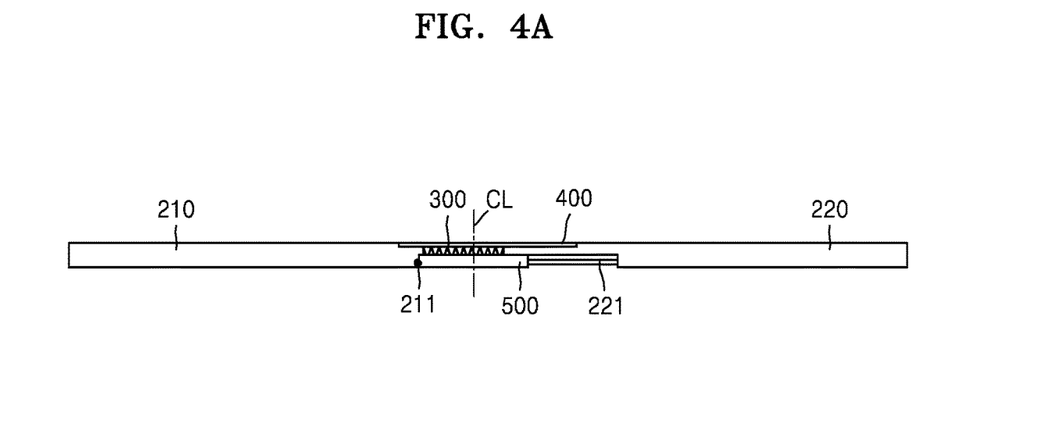
FIGS. 4A-4D are side views sequentially showing a change in the state of the foldable display apparatus of FIG. 1 from an unfolded state to a folded state.
Figure 5A:
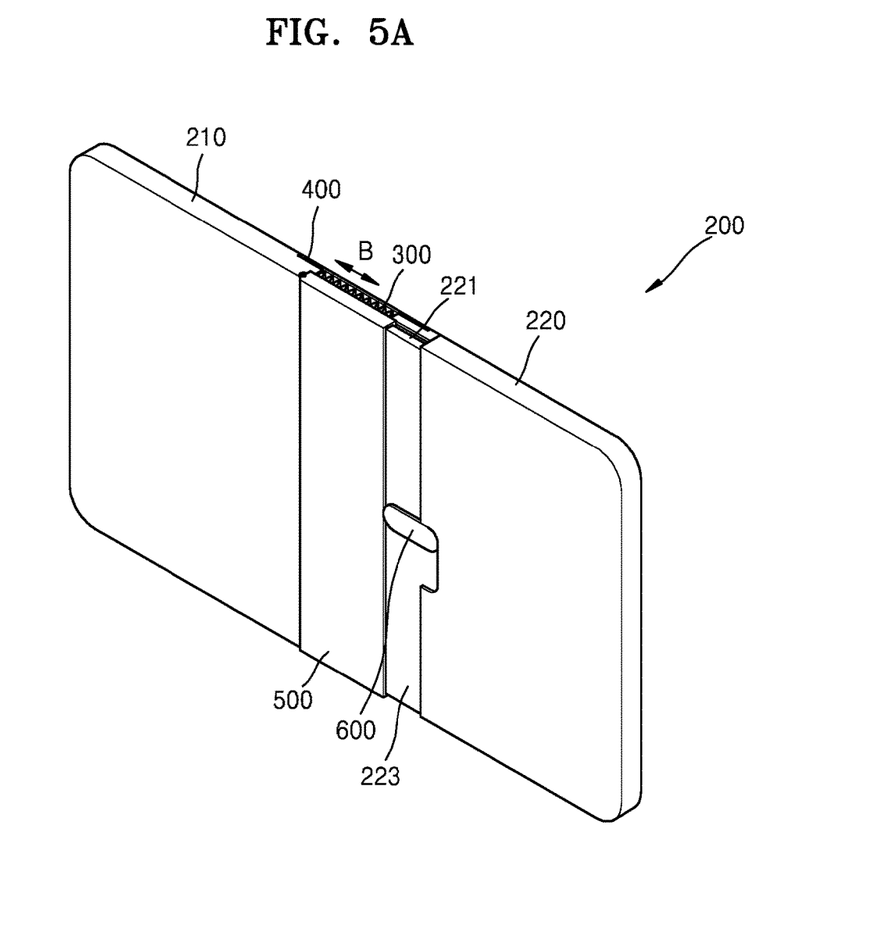
FIGS. 5A-5D are rear surface perspective views respectively corresponding to the processes of FIGS. 4A-4D.

First, when the foldable display apparatus is in an unfolded configuration where the foldable display apparatus is flat or substantially flat, the first case 210 and the second case 220 are unfolded to form a straight or substantially straight line, as shown in FIGS. 4A and 5A.

At this time, the locking lever 600 is in a state of blocking the slide cover 500 from moving along the rail groove 221. In other words, because the locking lever 600 blocks a moving path of the slide cover 500, the slide cover 500 is unable to move, and, as described above, the first and second cases 210 and 220 are also unable to move or rotate. Thus, the unfolded state in which the first and second cases 210 and 220 are unfolded to form a straight line is maintained. Accordingly, a user is able to view a plane image via the flexible display panel 100 that is unfolded to be flat.

Figure 4B:
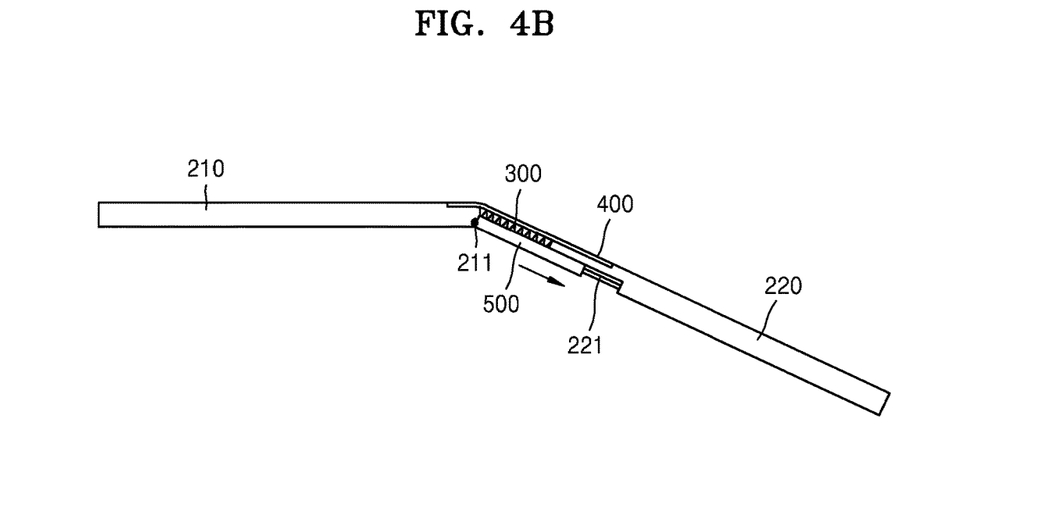
Figure 5B:
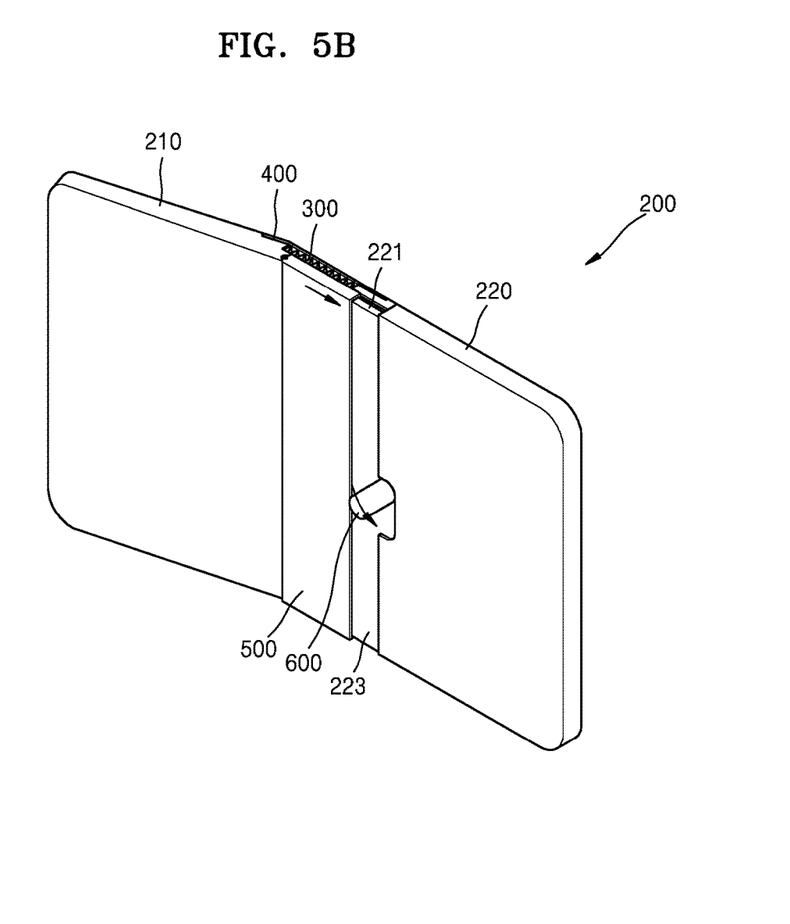

When the foldable display apparatus is stored or carried, for example, the locking lever 600 may be released, and the case 200 may be folded. To fold the case 200, when the locking lever 600 is slightly rotated, as shown in FIGS. 4B and 5B, the slide cover 500 is able to move along the rail groove 221 while pushing or further rotating the locking lever 600, and thus the first and second cases 210 and 220 are folded in a folding direction.

Figure 4C:
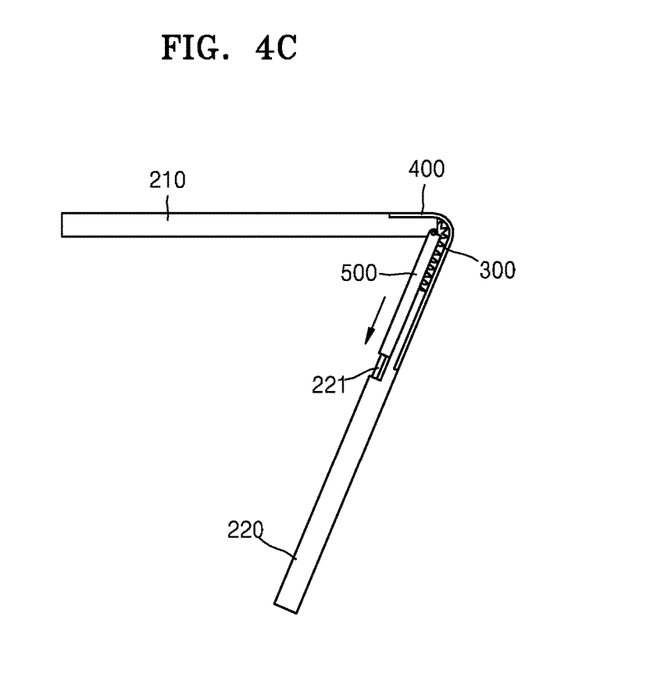
Figure 4D:
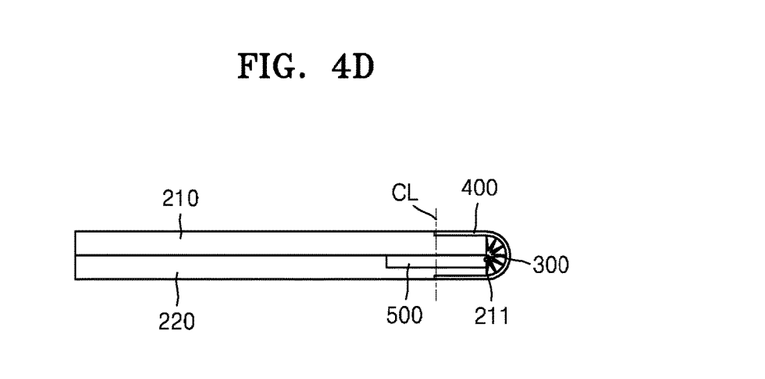
Figure 5C:
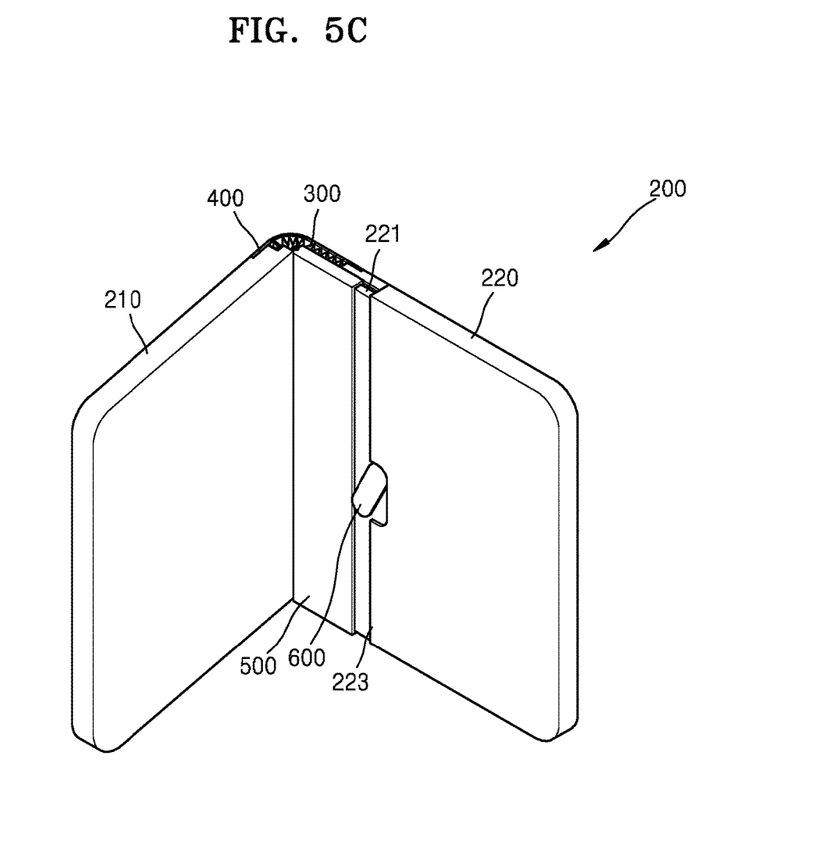
Figure 5D:
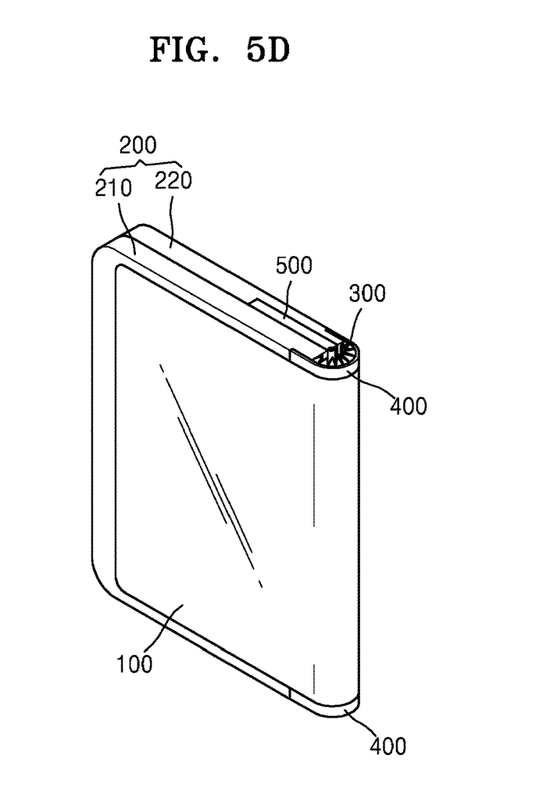

The first and second cases 210 and 220 may be folded past an angle of 90 degrees, as shown in FIGS. 4C and 5C, and may be folded to overlap with each other, as shown in FIGS. 4D and 5D. In this case, the flexible display panel 100 is outwardly exposed. Thus, even when the flexible display panel 100 is folded, a user may view an image displayed on the flexible display panel 100. Because the folded portion of the flexible display panel 100 is stably supported by the concave-convex type metal sheet 300, the folded portion is neither easily wrinkled nor deformed by an external force.

In the unfolded configuration, as shown in FIGS. 4A and 5A, a center CL of the body of the slide cover 500 is located at an area adjacent the concave-convex type metal sheet 300. However, in the folded configuration, as shown in FIGS. 4D and 5D, the center CL of the body of the slide cover 500 is moved to be at an area adjacent the second case 220.

On the other hand, when display apparatus is moved from the folded configuration to the unfolded configuration, the above-described process during folding is conducted in reverse order. When the unfolding has been completed, the locking lever 600 is rotated, as shown in FIGS. 4A and 5A, to prevent or inhibit the slide cover 500 from moving, and thus the unfolding state is stably maintained. Thus, a flat state of the display apparatus may be maintained (e.g., firmly maintained), and a stable plane image may be displayed.

Therefore, when the foldable display apparatus according to one or more exemplary embodiments of the present invention is folded, the foldable display apparatus may stably support a folded portion of a flexible display panel without wrinkling or breaking, and thus damage to the flexible display panel may be prevented, or the likelihood thereof may be reduced. When the foldable display apparatus is unfolded, the flexible display panel may be firmly maintained in a flat state, and thus a stable plane image may be displayed.

It should be understood that the exemplary embodiments described herein should be considered in a descriptive sense only and not for purposes of limitation. Descriptions of features or aspects within each embodiment should typically be considered as available for other similar features or aspects in other embodiments.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A case assembly for a foldable display device, the case assembly comprising:
a first case;
a second case spaced apart from the first case;
a concave-convex type link member located between the first case and the second case; and
a sliding structure combined with the second case,
wherein the sliding structure is combined with the second case such that the sliding structure relatively moves with respect to the second case in a second direction opposite to a first direction in which the second case relatively moves with respect to the sliding structure,
wherein the second direction is towards the concave-convex type link member or away from the concave-convex type link member,
wherein the first case has a first side and a second side opposite to the first side, the concave-convex type link member has a third side and a fourth side opposite to the third side, and the second case has a fifth side and a sixth side opposite to the fifth side,
wherein, when the concave-convex type link member is unfolded, the first side of the first case, the third side of the concave-convex type link member, and the fifth side of the second case are at a same side and the second side of the first case, the fourth side of the concave-convex type link member, and the sixth side of the second case are at a same side,
wherein the sliding structure comprises a first guiding part,
wherein the second case comprises a second guiding part,
wherein for the concave-convex type link member to be unfolded or folded, the first guiding part and the second guiding part are combined with each other such that the sliding structure and the second case guide each other and relatively move in opposite directions to each other,
wherein when the concave-convex type link member is folded such that the second side of the first case and the sixth side of the second case are opposite to each other and the first side of the first case and the fifth side of the second case face each other, one of the first guiding part and the second guiding part is inserted in the other one of the first and second guiding parts,
wherein the sliding structure comprises a first portion expanding in parallel with the fifth side of the second case and a second portion connected to and expanding perpendicularly to the first portion; and
wherein the first guiding part is located at the second portion.

2. The case assembly of claim 1, wherein when the concave-convex type link member is unfolded, the second side of the first case, the fourth side of the concave-convex type link member, and the sixth side of the second case are substantially planar.

3. The case assembly of claim 1, wherein the concave-convex type link member comprises a plurality of connectors connected to each other, and
wherein a width of each of plurality of the connectors increases in a direction from the third side of the concave-convex type link member to the fourth side of the concave-convex type link member.

4. The case assembly of claim 3, wherein when the concave-convex type link member is folded such that the second side of the first case and the sixth side of the second case are opposite to each other and the first side of the first case and the fifth side of the second case face each other, the concave-convex type link member has a substantially semi-circular cross-section.

5. The case assembly of claim 1, wherein when the concave-convex type link member is unfolded, the fourth side of the concave-convex type link member is relatively planar compared to the third side of the concave-convex type link member.

6. The case assembly of claim 1, wherein at least a portion of the sliding structure is a rigid plate.

7. The case assembly of claim 1, wherein when the concave-convex type link member is folded such that the second side of the first case and the sixth side of the second case are opposite to each other and the first side of the first case and the fifth side of the second case face each other, the first guiding part is inserted in the second guiding part.

8. The case assembly of claim 1, wherein the concave-convex type link member comprises a metal.

9. The case assembly of claim 1, wherein when the concave-convex type link member is unfolded, the concave-convex type link member and the sliding structure overlap with each other.

10. The case assembly of claim 9, wherein when the concave-convex type link member is folded such that the second side of the first case and the sixth side of the second case are opposite to each other and the first side of the first case and the fifth side of the second case face each other, the concave-convex type link member and the sliding structure do not overlap with each other.

11. The case assembly of claim 1, wherein for the concave-convex type link member to be unfolded, the sliding structure is relatively moved with respect to the second case in the second direction towards the concave-convex type link member.

12. The case assembly of claim 11, wherein for the concave-convex type link member to be folded such that the second side of the first case and the sixth side of the second case are opposite to each other and the first side of the first case and the fifth side of the second case face each other, the sliding structure is relatively moved with respect to the second case in the second direction away from the concave-convex type link member.

13. The case assembly of claim 1, wherein the sliding structure is rotatably connected to the first case.

14. A foldable display device, comprising:
a first case;
a second case spaced apart from the first case;
a concave-convex type link member located between the first case and the second case; and
a sliding structure combined with the second case,
wherein the sliding structure is combined with the second case such that the sliding structure relatively moves with respect to the second case in a second direction opposite to a first direction in which the second case relatively moves with respect to the sliding structure,
wherein the second direction is towards the concave-convex type link member or away from the concave-convex type link member,
wherein the first case has a first side and a second side opposite to the first side, the concave-convex type link member has a third side and a fourth side opposite to the third side, and the second case has a fifth side and a sixth side opposite to the fifth side,
wherein when the concave-convex type link member is unfolded, the first side of the first case, the third side of the concave-convex type link member, and the fifth side of the second case are on a same side and the second side of the first case, the fourth side of the concave-convex type link member, and the sixth side of the second case are on same side,
wherein the sliding structure comprises a first guiding part,
wherein the second case comprises a second guiding part,
wherein for the concave-convex type link member to be unfolded or folded, the first guiding part and the second guiding part are combined with each other such that the sliding structure and the second case guide each other and relatively move in opposite directions to each other,
wherein when the concave-convex type link member is folded such that the second side of the first case and the sixth side of the second case are opposite to each other and the first side of the first case and the fifth side of the second case face each other, one of the first guiding part and the second guiding part is inserted in the other one of the first and second guiding parts,
wherein a flexible display panel is continuously located on the second side of the first case, the fourth side of the concave-convex type link member, and the sixth side of the second case, the flexible display panel having a seventh side facing the second side of the first case, the fourth side of the concave-convex type link member, and the sixth side of the second case, and an eighth side opposite to the seventh side,
wherein when the concave-convex type link member is folded such that the second side of the first case and the sixth side of the second case are opposite to each other and the first side of the first case and the fifth side of the second case face each other, a portion of the eighth side of the flexible display panel corresponding to the concave-convex type link member has a tensile force,
wherein the sliding structure comprises a first portion expanding in parallel with the fifth side of the second case and a second portion connected to and expanding perpendicularly to the first portion, and
wherein the first guiding part is located at the second portion.

15. The foldable display device of claim 14, wherein when the concave-convex type link member is unfolded, the second side of the first case, the fourth side of the concave-convex type link member, and the sixth side of the second case are substantially planar.

16. The foldable display device of claim 14, wherein the concave-convex type link member comprises a plurality of connectors connected to each other, and
wherein a width of each of the plurality of connectors increases in a direction from the third side of the concave-convex type link member to the fourth side of the concave-convex type link member.

17. The foldable display device of claim 16, wherein when the concave-convex type link member is folded such that the second side of the first case and the sixth side of the second case are opposite to each other and the first side of the first case and the fifth side of the second case face each other, the concave-convex type link member has a substantially semicircular cross-section.

18. The foldable display device of claim 14, wherein when the concave-convex type link member is unfolded, the fourth side of the concave-convex type link member is relatively more planar than the third side of the concave-convex type link member.

19. The foldable display device of claim 14, wherein at least a portion of the sliding structure is a rigid plate.

20. The foldable display device of claim 14, wherein when the concave-convex type link member is folded such that the second side of the first case and the sixth side of the second case are opposite to each other and the first side of the first case and the fifth side of the second case face each other, the first guiding part is inserted in the second guiding part.

21. The foldable display device of claim 14, wherein the concave-convex type link member comprises a metal.

22. The foldable display device of claim 14, wherein when the concave-convex type link member is unfolded, the concave-convex type link member and the sliding structure overlap with each other.

23. The foldable display device of claim 22, wherein when the concave-convex type link member is folded such that the second side of the first case and the sixth side of the second case are opposite to each other and the first side of the first case and the fifth side of the second case face each other, the concave-convex type link member and the sliding structure do not overlap each other.

24. The foldable display device of claim 14, wherein for the concave-convex type link member to be unfolded, the sliding structure is relatively moved in the second direction towards the concave-convex type link member.

25. The foldable display device of claim 24, wherein for the concave-convex type link member to be folded such that the second side of the first case and the sixth side of the second case are opposite to each other and the first side of the first case and the fifth side of the second case face each other, the sliding structure is relatively moved with respect to the second case in the second direction away from the concave-convex type link member.

26. The foldable display device of claim 14, wherein the sliding structure is rotatably connected to the first case.

27. A case assembly for a foldable display device, the case assembly comprising:
   a first case;
   a second case spaced apart from the first case;
   a concave-convex type link member between the first case and the second case; and
   a sliding structure combined with the second case such that the sliding structure is slidable with respect to the second case,
   wherein the sliding structure comprises a first guiding part,
   wherein the second case comprises a second guiding part, and
   wherein when the concave-convex type link member is unfolded or folded, the first guiding part and the second guiding part are combined with each other such that the sliding structure and the second case guide each other and relatively move in opposite directions to each other,
   wherein the sliding structure comprises a first portion expanding in parallel with a side of the second case and a second portion connected to and expanding perpendicularly to the first portion; and
   wherein the first guiding part is located at the second portion.

* * * * *